US012793801B2

(12) United States Patent

Lang et al.

(10) Patent No.: US 12,793,801 B2

(45) Date of Patent: Nov. 10, 2026

(54) WORD LINE BASED PROGRAM VOLTAGE ADJUSTMENT

(71) Applicant: Micron Technology, Inc., Boise, ID (US)

(72) Inventors: Murong Lang, San Jose, CA (US); Peng Zhang, Los Altos, CA (US); Lei Lin, Fremont, CA (US); Zhenming Zhou, San Jose, CA (US); Jun Wan, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 199 days.

(21) Appl. No.: 18/739,769

(22) Filed: Jun. 11, 2024

(65) Prior Publication Data

US 2024/0420784 A1 Dec. 19, 2024

Related U.S. Application Data

(60) Provisional application No. 63/472,712, filed on Jun. 13, 2023.

(51) Int. Cl.
*G11C 16/34* (2006.01)
*G11C 16/10* (2006.01)

(52) U.S. Cl.
CPC ........ *G11C 16/3495* (2013.01); *G11C 16/102* (2013.01); *G11C 16/3418* (2013.01)

(58) Field of Classification Search
CPC .............. G11C 16/3495; G11C 16/102; G11C 16/3418
USPC .................................................... 365/185.22
See application file for complete search history.

(56) References Cited

U.S. PATENT DOCUMENTS

2007/0253256 A1* 11/2007 Aritome .............. G11C 11/5628 365/185.24
2015/0092488 A1* 4/2015 Wakchaure ............ G11C 16/26 365/185.18
2019/0066818 A1* 2/2019 Lee .................. G11C 29/50012

* cited by examiner

*Primary Examiner* — Alexander Sofocleous
*Assistant Examiner* — Duy H Luong
(74) *Attorney, Agent, or Firm* — Schwegman Lundberg & Woessner, P.A.

(57) ABSTRACT

Aspects of the present disclosure configure a memory sub-system controller to selectively adjust a program pulse for different word line groups of a memory sub-system. The controller receives a request to program data to an individual memory component of a set of memory components. The controller determines that a program erase count (PEC) associated with the individual memory component transgresses a threshold value. The controller, in response to determining that the PEC associated with the individual memory component transgresses the threshold value, selectively adjusts a predetermined program voltage (Vpgm) associated with a subset of word lines (WLs) of the individual memory component based on whether the subset of WLs is associated with an individual WL group (WLG). The controller programs the data to the individual memory component according to the selectively adjusted predetermined Vpgm.

20 Claims, 7 Drawing Sheets

400

Prog temp>=10C

| Trim (1 DAC = 27 mV) | POR | Offset | | |
|---|---|---|---|---|
| | | 0 | 3000 | 4000 |
| step_vpgm__w gp0 | 21 | 0 | 0 | 0 |
| step_vpgm__w gp1 | 23 | 0 | 0 | 0 |
| step_vpgm__w gp2 | 23 | 0 | **-1** | **-1** |
| step_vpgm__w gp3 | 23 | 0 | **-1** | **-1** |
| step_vpgm__w gp4 | 23 | 0 | **-1** | **-1** |
| step_vpgm__w gp5 | 20 | 0 | 0 | 0 |
| step_vpgm__w gp6 | 19 | 0 | 0 | 0 |
| step_vpgm__w gp7 | 19 | 0 | 0 | 0 |
| step_vpgm__w gp8 | 17 | 0 | 0 | 0 |
| step_vpgm__w gp9 | 20 | 0 | 0 | 0 |
| step_vpgm__w gp10 | 20 | 0 | 0 | 0 |
| step_vpgm__w gp11 | 20 | 0 | 0 | 0 |
| step_vpgm__w gp12 | 18 | 0 | 0 | 0 |
| step_vpgm__w gp13 | 17 | 0 | 0 | 0 |
| step_vpgm__w gp14 | 18 | 0 | 0 | 0 |
| step_vpgm__w gp15 | 18 | 0 | 0 | 0 |

410, 420, 430, 432, 434, 436, 450, 452, 454, 456, 458, 460, 462, 464, 466, 468

*FIG. 4*

500

510

Prog temp<10C

| Trim (1 DAC = 27 mV) | POR | Offset | | |
|---|---|---|---|---|
| | | 0 | 3000 | 4000 |
| step_vpgm__w gp0 | 21 | 0 | 0 | 0 |
| step_vpgm__w gp1 | 23 | 0 | 0 | 0 |
| step_vpgm__w gp2 | 23 | 0 | **-2** | **-2** |
| step_vpgm__w gp3 | 23 | 0 | **-2** | **-2** |
| step_vpgm__w gp4 | 23 | 0 | **-2** | **-2** |
| step_vpgm__w gp5 | 20 | 0 | 0 | 0 |
| step_vpgm__w gp6 | 19 | 0 | 0 | 0 |
| step_vpgm__w gp7 | 19 | 0 | 0 | 0 |
| step_vpgm__w gp8 | 17 | 0 | 0 | 0 |
| step_vpgm__w gp9 | 20 | 0 | 0 | 0 |
| step_vpgm__w gp10 | 20 | 0 | 0 | 0 |
| step_vpgm__w gp11 | 20 | 0 | 0 | 0 |
| step_vpgm__w gp12 | 18 | 0 | 0 | 0 |
| step_vpgm__w gp13 | 17 | 0 | -2 | -2 |
| step_vpgm__w gp14 | 18 | 0 | 0 | 0 |
| step_vpgm__w gp15 | 18 | 0 | 0 | 0 |

450, 452, 454, 520, 522, 530, 532, 534, 536

*FIG. 5*

WORD LINE BASED PROGRAM VOLTAGE ADJUSTMENT

PRIORITY APPLICATION

This application claims the benefit of priority to U.S. Provisional Application Ser. No. 63/472,712, filed Jun. 13, 2023, which is incorporated herein by reference in its entirety.

TECHNICAL FIELD

This disclosure relates generally to memory sub-systems and, more specifically, to providing adaptive media management for memory components, such as memory dies.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data on the memory components and to retrieve data from the memory components.

BRIEF DESCRIPTION OF THE DRAWINGS

The present disclosure will be understood more fully from the detailed description given below and from the accompanying drawings of various embodiments of the disclosure.

FIGS. 4 and 5 are block diagrams of examples of tables used to selectively adjust the predetermined Vpgm of certain WL groups (WLGs), in accordance with some implementations of the present disclosure.

DETAILED DESCRIPTION

Figure 1:
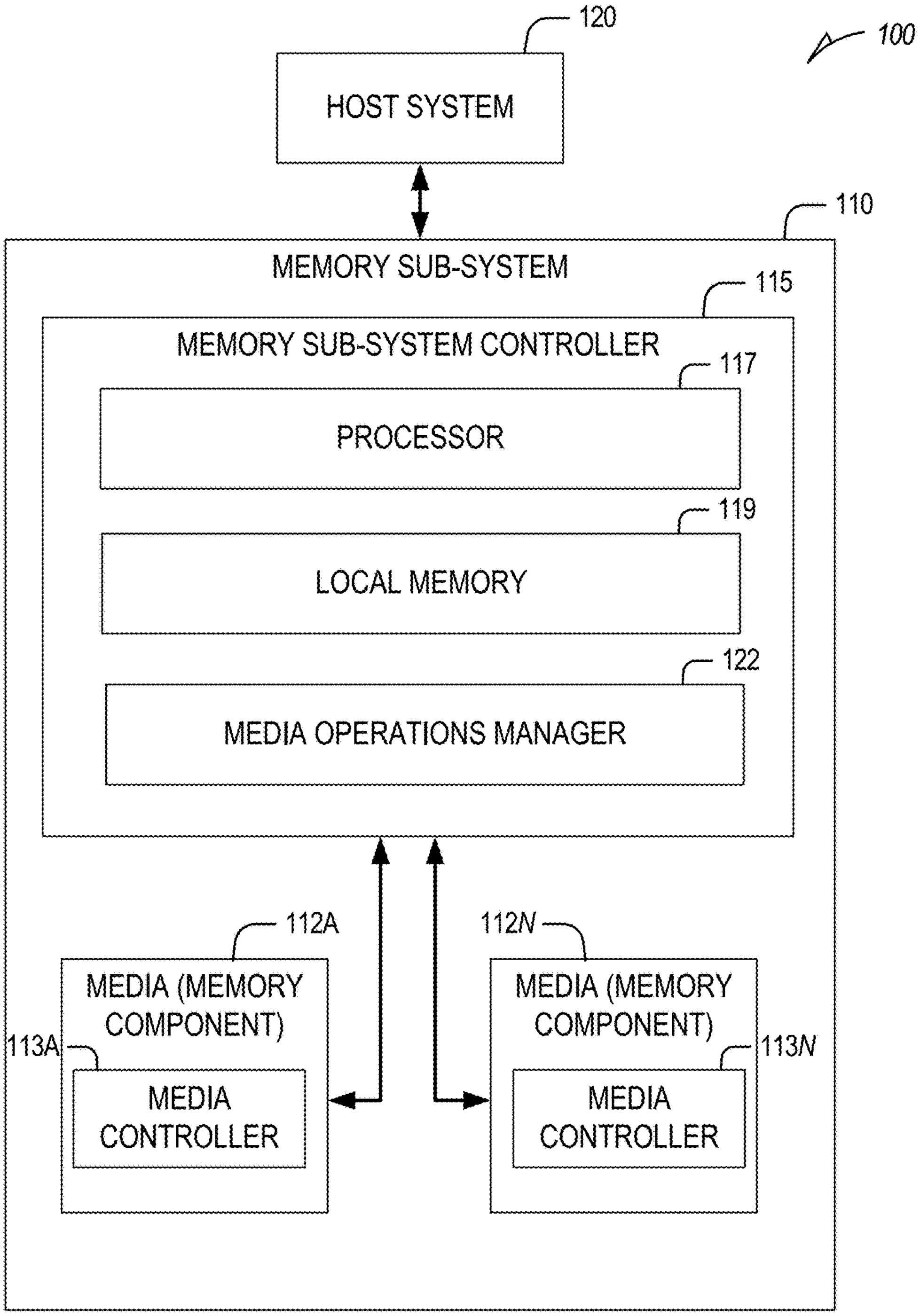
FIG. 1 is a block diagram illustrating an example computing environment including a memory sub-system, in accordance with some embodiments of the present disclosure.

Aspects of the present disclosure configure a system component, such as a memory sub-system controller, to perform selective Vpgm adjustments on a WL group (WLG) basis and based on a program erase count (PEC) of a memory component. The memory sub-system controller can compare wear and/or PEC of a memory component (e.g., a block) of the memory sub-system to which data needs to be programmed. The memory sub-system controller can selectively control whether the Vpgm of a set of WLs of the memory component is adjusted based on the wear and/or PEC of the memory component. Based on the PEC and/or wear of different WLGs, the memory sub-system controller can selectively program data to the memory component using a predetermined Vpgm for some WLGs and using an adjusted Vpgm for other WLGs (e.g., WLGs for which a reliability value fails to transgress a reliability threshold). This ensures that performance of the memory system remains optimal by only reducing the speed at which data is programmed (e.g., as a result of reducing the Vpgm) for certain WLs and not other WLs of a memory block or other memory component. This improves the overall efficiency of operating the memory sub-system.

A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components, such as memory devices (e.g., memory dies or planes across multiple memory dies) that store data. The host system can send access requests (e.g., write command, read command) to the memory sub-system, such as to store data at the memory sub-system and to read data from the memory sub-system. The data (or set of data) specified by the host is hereinafter referred to as "host data," "application data," or "user data".

The memory sub-system can initiate media management operations, such as a write operation, on host data that is stored on a memory device. Data is usually written or programmed to the memory sub-system using a certain predetermined Vpgm. In some cases, the predetermined Vpgm is different for different WLGs and/or individual WLs. In some examples, firmware of the memory sub-system may re-write previously written host data from a location on a memory device to a new location as part of garbage collection management operations. The data that is re-written, for example as initiated by the firmware, is hereinafter referred to as "garbage collection data". "User data" can include host data and garbage collection data. "System data" hereinafter refers to data that is created and/or maintained by the memory sub-system for performing operations in response to host requests and for media management. Examples of system data include, and are not limited to, system tables (e.g., logical-to-physical address mapping table), data from logging, scratch pad data, etc.

Many different media management operations can be performed on the memory device. For example, the media management operations can include different scan rates, different scan frequencies, different wear leveling, different read disturb management, different near miss error correction code (ECC), and/or different dynamic data refresh. Wear leveling ensures that all blocks in a memory component approach their defined erase-cycle budget at the same time, rather than some blocks approaching it earlier. Read disturb management counts all of the read operations to the memory component. If a certain threshold is reached, the surrounding regions are refreshed. Near-miss ECC refreshes all data read by the application that exceeds a configured threshold of errors. Dynamic data-refresh scan reads all data and identifies the error status of all blocks as a background operation. If a certain threshold of errors per block or ECC unit is exceeded in this scan-read, a refresh operation is triggered.

A memory device can be a non-volatile memory device. A non-volatile memory device is a package of one or more dice (or dies). Each die can be comprised of one or more planes. For some types of non-volatile memory devices (e.g., NAND devices), each plane is comprised of a set of physical blocks. For some memory devices, blocks are the smallest area that can be erased. Such blocks can be referred to or addressed as logical units (LUN). Each block is comprised of a set of pages. Each page is comprised of a set of memory cells, which store bits of data. The memory devices can be raw memory devices (e.g., NAND), which are managed externally, for example, by an external controller. The memory devices can be managed memory devices (e.g., managed NAND), which is a raw memory device combined with a local embedded controller for memory management within the same memory device package.

There are challenges in efficiently managing or performing media management operations on typical memory devices. Specifically, certain memory devices, such as NAND flash devices, include large die-by-die reliability (RWB) variation. As the technology for such memory devices continues to be scaled down, this die-by-die reliability variation becomes more pronounced and problematic in performing memory management. Current memory systems (e.g., SSD drive or die package systems) associate all of the memory devices or memory dies in the memory system with a certain reliability specification. Such reliability specifications can be set based on a read bit error rate (RBER) of different portions of the memory sub-system. In some cases, each block of each memory device is associated with a reliability grade or specification which is used to determine whether the block is a good block or a bad block. Good blocks are those that have reliability grades (e.g., RBER values) above a reliability threshold (e.g., above an RBER threshold) and bad blocks are blocks that have reliability grades below a reliability threshold. The reliability grades can be set at manufacture or during operation of the memory devices, such as by measuring the data retention and/or error rate associated with particular blocks.

Certain memory systems control the Vpgm that is used to program or store data to the memory components and/or individual WLs of the memory components based on a PEC of the memory components. For example, when the memory components reach a certain level of PEC, these memory systems can reduce the Vpgm used to store data to the memory components which slows down the time it takes to program data to the memory components. Namely, as the PEC of the memory components reaches a certain level, which can correspond to or can be near the end-of-life (EOL) of the memory subsystem, a greater number of RBER can result when reading data and/or when writing data. To reduce the likelihood and the error rate for such memory components that are reaching their EOL, the memory sub-systems can program data to the memory components at a slower rate, such as by reducing the predetermined Vpgm used to program the data. While this approach improves the reliability of the memory sub-system, programming data at such a slower rate may cause the memory sub-system to fail to meet certain quality or manufacturing standards and expectations. Certain WLs within the memory component can be more prone to errors than other WLs and so applying the same reduction to the Vpgm to all of the WLs when the memory component reaches the EOL may be unnecessary. Particularly, applying a one-size-fits-all approach to the Vpgm of all the WLs of an individual memory component when that component is reaching its EOL may reduce the overall capabilities and quality of the memory sub-system beyond what is needed. This creates significant inefficiencies and wastes resources.

Aspects of the present disclosure address the above and other deficiencies by providing a memory controller that can selectively adjust the Vpgm (or program speed) for certain WLGs and not others when the memory components are reaching their EOL or when the memory components reach a certain level of PEC. The WLGs for which the Vpgm is adjusted can represent or include WLs that have a reliability value that is below a reliability threshold (e.g., have RBER that is below an RBER threshold). In this way, by only adjusting the program speed for certain WLGs and not all of the WLGs, the performance of the memory sub-system can remain near optimal and the memory sub-system can continue operating in an efficient manner. Namely, rather than reducing the program speed of all of the WLs in the memory component that is reaching the EOL, the program speed of only some WLs is adjusted which keeps the memory sub-system operating as expected and specified by the quality and manufacturing standards.

In some examples, the memory controller receives a request to program data to an individual memory component of the set of memory components. The memory controller determines that a PEC associated with the individual memory component transgresses a threshold value. In some examples, the threshold value includes at least 3000 PEC. The memory controller, in response to determining that the PEC associated with the individual memory component transgresses the threshold value, selectively adjusts a predetermined Vpgm associated with a subset of WLs of the individual memory component based on whether the subset of WLs is associated with an individual WLG. The memory controller programs the data to the individual memory component according to the selectively adjusted predetermined Vpgm. In some examples, the memory sub-system includes a three-dimensional (3D) NAND memory.

In some examples, the memory controller determines that a first set of WLs of the individual memory component is associated with a first WLG. The memory controller determines that a second set of WLs of the individual memory component is associated with a second WLG. The memory controller adjusts the predetermined Vpgm associated with the first set of WLs in response to determining that the first set of WLs are associated with the first WLG. The memory controller programs data to the individual memory component using the adjusted Vpgm for the first set of WLs and using the predetermined Vpgm for the second set of WLs.

In some examples, the first WLG includes a first plurality of WLs having a first reliability value that falls below a reliability threshold. The second WLG includes a second plurality of WLs having a second reliability value that exceeds the reliability threshold. In some examples, the first and second reliability values include respective RBERs and wherein the reliability threshold includes a minimum RBER.

In some examples, the memory controller accesses configuration data including a table that associates different WLGs with respective Vpgm adjustments based on PEC values. In some cases, the table includes: a first WLG associated with a first predetermined Vpgm; a first PEC threshold associated with a first adjustment to the first predetermined Vpgm; and a second PEC threshold associated with a second adjustment to the first predetermined Vpgm. In some cases, the table further includes: a second WLG associated with a second predetermined Vpgm; the first PEC threshold associated with a third adjustment to the second predetermined Vpgm; and the second PEC threshold associated with a fourth adjustment to the second predetermined Vpgm.

In some examples, the memory controller adjusts the predetermined Vpgm by applying a step static threshold voltage to the predetermined Vpgm. In some cases, the memory controller determines a current temperature associated with the memory sub-system. The memory controller selects an adjustment value to apply to the predetermined Vpgm based on the current temperature.

In some examples, the memory controller determines that the current temperature is below a threshold temperature value. The memory controller, in response to determining that the current temperature is below the threshold temperature value, applies a first adjustment to the predetermined Vpgm associated with the subset of WLs.

In some examples, the memory controller determines that the current temperature is above the threshold temperature value. The memory controller, in response to determining that the current temperature is above the threshold temperature value, applies a second adjustment to the predetermined Vpgm associated with the subset of WLs. In some aspects, the second adjustment is lower than the first adjustment. In some examples, the memory controller identifies a second subset of WLs associated with a second WLG having a predetermined Vpgm that is associated with an adjustment to a corresponding Vpgm when the current temperature is below the threshold temperature value and for which the corresponding Vpgm remains unchanged when the current temperature is above the threshold temperature value.

In some examples, the memory controller stores first and second tables. The first table includes a first set of adjustments to apply to Vpgms of WLGs when the current temperature is below a threshold temperature value. The second table includes a second set of adjustments to apply to Vpgms of WLGs when the current temperature is above the threshold temperature value. In some examples, the memory controller selectively accesses one of the first and second tables based on the current temperature of the memory sub-system. In some examples, the threshold value includes a first threshold value. In such cases, the memory controller adjusts the predetermined Vpgm associated with the subset of WLs by a second amount in response to determining that the PEC associated with the individual memory component transgresses a second threshold value that is greater than the first threshold value.

Though various embodiments are described herein as being implemented with respect to a memory sub-system (e.g., a controller of the memory sub-system), some or all of the portions of an embodiment can be implemented with respect to a host system, such as a software application or an operating system of the host system.

FIG. 1 illustrates an example computing environment 100 including a memory sub-system 110, in accordance with some examples of the present disclosure. The memory sub-system 110 can include media, such as memory components 112A to 112N (also hereinafter referred to as "memory devices"). The memory components 112A to 112N can be volatile memory devices, non-volatile memory devices, or a combination of such. The memory components 112A to 112N can be implemented by individual dies, such that a first memory component 112A can be implemented by a first memory die (or a first collection of memory dies) and a second memory component 112N can be implemented by a second memory die (or a second collection of memory dies). Each memory die can include a plurality of planes in which data can be stored or programmed.

In some examples, the first memory component 112A including (a WL, a WLG, a block, or page of the first memory component 112A), or group of memory components including the first memory component 112A can be associated with a first reliability (capability) grade, value, measure, or lifetime PEC. The terms "reliability grade," "value" and "measure" are used interchangeably throughout and can have the same meaning. The second memory component 112N (a WL, a WLG, a block, or page of the second memory component 112N) or group of memory components including the second memory component 112N can be associated with a second reliability (capability) grade, value, measure, or lifetime PEC. In some examples, each memory component 112A to 112N can store respective configuration data that specifies the respective reliability grade and lifetime PEC and current PEC. In some examples, a memory or register can be associated with all of the memory components 112A to 112N and can store a table that maps different groups, bins or sets of the memory components 112A to 112N to respective reliability grades, lifetime PEC values, and/or current PEC values.

In some examples, a memory or register can be associated with all of the memory components 112A to 112N and can store a table that maps different WLGs of the memory components 112A to 112N to Vpgm adjustment values. The table can indicate, for different amounts of PEC of the memory components 112A to 112N, which Vpgm adjustment values to apply to different WLGs. For example, when the PEC of an individual one of the memory components 112A to 112N is below a first threshold value, the same Vpgm adjustment value (e.g., a 0 adjustment value) is applied to the default or predetermined Vpgm of each WLG. When the PEC of the individual one of the memory components 112A to 112N transgresses the first threshold value and is below a second threshold value, a first set of Vpgm adjustment values (e.g., a −1 adjustment value corresponding to −27 mV) can be applied to the predetermined Vpgm of a first set of WLGs and no adjustment (e.g., 0 adjustment value) can be applied to the predetermined Vpgm of a second set of WLGs. In some cases, when the PEC of the individual one of the memory components 112A to 112N transgresses the second threshold value, a second set of Vpgm adjustment values (e.g., a −2 adjustment value corresponding to −54 mV) can be applied to the predetermined Vpgm of the first set of WLGs and a first set of Vpgm adjustment values (e.g., −1 adjustment value corresponding to −27 mV) can be applied to the predetermined Vpgm of the second set of WLGs but not a third set of WLGs. In this way, using the table, the media operations manager 122 can dynamically control the write or program speed of different WLGs (e.g., by selectively adjusting the Vpgm of some of the WLGs) of an individual one of the memory components 112A to 112N on the basis of the PEC of that memory component. This can thereby maintain the efficiency of operating the memory sub-system at an optimal level even when the EOL is being reached for certain memory components.

In some examples, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to a memory system. The memory system can include one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND)-type flash memory and/or a 3D NAND flash memory. Each of the memory components 112A to 112N can include one or more arrays of memory cells such as single-level cells (SLCs) or multi-level cells (MLCs) (e.g., TLCs or QLCs). In some examples, a particular memory component 112 can include both an SLC portion and an MLC portion of memory cells. Each of the memory cells can store one or more bits of data (e.g., blocks) used by the host system 120. Although non-volatile memory components such as NAND-type flash memory are described, the memory components 112A to 112N can be based on any other type of memory, such as a volatile memory. In some examples, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells.

A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or blocks that can refer to a unit of the memory component 112 used to store data. For example, a single first row that spans a first set of the pages or blocks of the memory components 112A to 112N can correspond to or be grouped as a first block stripe and a single second row that spans a second set of the pages or blocks of the memory components 112A to 112N can correspond to or be grouped as a second block stripe.

The memory sub-system controller 115 can communicate with the memory components 112A to 112N to perform memory operations such as reading data, writing data, or erasing data at the memory components 112A to 112N and other such operations. The memory sub-system controller 115 can communicate with the memory components 112A to 112N to perform various memory management operations, such as different scan rates, different scan frequencies, different wear leveling, different read disturb management, garbage collection operations, different near miss ECC operations, and/or different dynamic data refresh.

The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another example of the present disclosure, a memory sub-system 110 may not include a memory sub-system controller 115, and can instead rely upon external control (e.g., provided by an external host, or by a processor 117 or controller separate from the memory sub-system 110).

In general, the memory sub-system controller 115 can receive commands or operations from the host system 120 and can convert the commands or operations into instructions or appropriate commands to achieve the desired access to the memory components 112A to 112N. In some examples, the commands or operations received from the host system 120 can specify configuration data for the memory components 112N to 112N. The configuration data can describe the lifetime PEC values and/or reliability grades associated with different groups of the memory components 112N to 112N and/or different WLs, WLGs, and/or blocks within each of the memory components 112N to 112N.

The memory sub-system controller 115 can be responsible for other memory management operations, such as wear leveling operations, garbage collection operations, error detection and error-correcting code (ECC) operations, encryption operations, caching operations, and address translations. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM or other temporary storage location or device) and address circuitry (e.g., a row decoder and a column decoder) that can receive an address from the memory sub-system controller 115 and decode the address to access the memory components 112A to 112N.

The memory devices can be raw memory devices (e.g., NAND), which are managed externally, for example, by an external controller (e.g., memory sub-system controller 115). The memory devices can be managed memory devices (e.g., managed NAND), which is a raw memory device combined with a local embedded controller (e.g., local media controllers) for memory management within the same memory device package. Any one of the memory components 112A to 112N can include a media controller (e.g., media controller 113A and media controller 113N) to manage the memory cells of the memory component (e.g., to perform one or more memory management operations), to communicate with the memory sub-system controller 115, and to execute memory requests (e.g., read or write) received from the memory sub-system controller 115.

The memory sub-system controller 115 can include a media operations manager 122. The media operations manager 122 can be configured to selectively adjust the Vpgm (or program speed) for certain WLGs and not others when the memory components are reaching their EOL or when the memory components reach a certain level of PEC. The WLGs for which the Vpgm is adjusted can represent or include WLs that have a reliability value that is below a reliability threshold (e.g., have RBER that is below an RBER threshold). In this way, by only adjusting the program speed for certain WLGs and not all of the WLGs, the performance of the memory sub-system 110 can remain near optimal and the memory sub-system 110 can continue operating in an efficient manner. Namely, rather than reducing the program speed of all of the WLs in the memory component that is reaching the EOL, the program speed of only some WLs is adjusted which keeps the memory sub-system 110 operating as expected and specified by the quality and manufacturing standards. This improves the overall efficiency of operating the memory sub-system 110.

In some examples, the media operations manager 122 can comprise logic (e.g., a set of transitory or non-transitory machine instructions, such as firmware) or one or more components that causes the media operations manager 122 to perform operations described herein. The media operations manager 122 can comprise a tangible or non-tangible unit capable of performing operations described herein. Further details with regards to the operations of the media operations manager 122 are described below.

Figure 2:
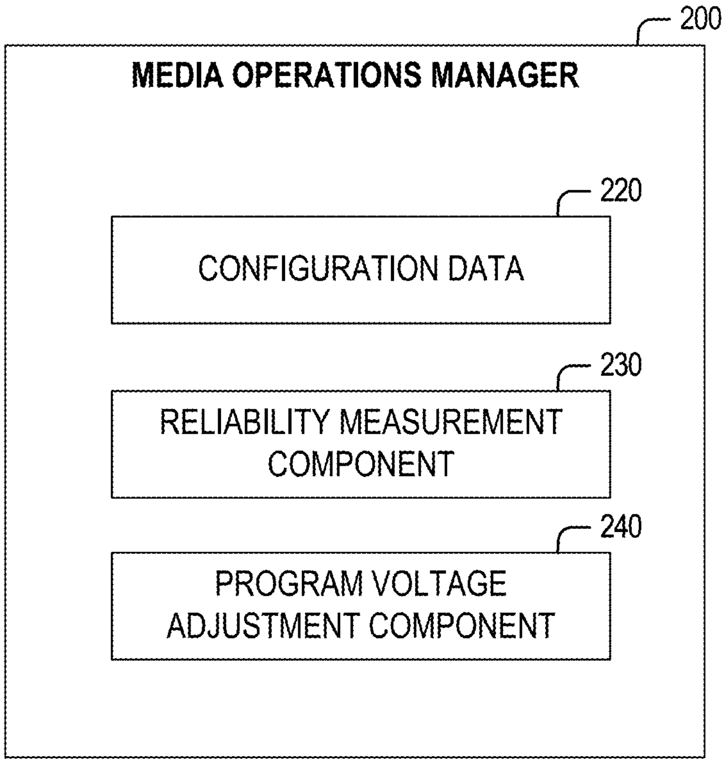
FIG. 2 is a block diagram of an example media operations manager, in accordance with some implementations of the present disclosure.

FIG. 2 is a block diagram of an example media operations manager 200 (corresponding to media operations manager 122), in accordance with some implementations of the present disclosure. As illustrated, the media operations manager 200 includes configuration data 220, a reliability measurement component 230, and a program voltage adjustment component 240. For some cases, the media operations manager 200 can differ in components or arrangement (e.g., less or more components) from what is illustrated in FIG. 2.

The configuration data 220 accesses and/or stores configuration data associated with the memory components 112A to 112N. In some examples, the configuration data 220 is programmed into the media operations manager 200. For example, the media operations manager 200 can communicate with the memory components 112A to 112N to obtain the configuration data and store the configuration data 220 locally on the media operations manager 122. In some examples, the media operations manager 122 communicates with the host system 120. The host system 120 receives input from an operator or user that specifies parameters including lifetime PEC values of different WLs, WLGs, bins, groups, blocks, block stripes, memory dies and/or sets of the memory components 112A to 112N. The media operations manager 122 receives configuration data from the host system 120 and stores the configuration data in the configuration data 220.

The configuration data 220 can store a table that maps different WLGs of the memory components 112A to 112N to Vpgm adjustment values. The table can indicate for different amounts of PEC of the memory components 112A to 112N, which Vpgm adjustment values to apply to different WLGs. In some cases, two or more tables can be maintained that have different Vpgm adjustment values based on a current temperature of the memory sub-system 110.

For example, each table can store an indication that when the PEC of an individual one of the memory components 112A to 112N is below a first threshold value, the same Vpgm adjustment value (e.g., a 0 adjustment value) is applied to the default or predetermined Vpgm of each WLG. When the PEC of the individual one of the memory components 112A to 112N transgresses the first threshold value and is below a second threshold value, a first set of Vpgm adjustment values (e.g., a −1 adjustment value corresponding to −27 mV) can be applied to the predetermined Vpgm of a first set of WLGs and no adjustment (e.g., 0 adjustment value) can be applied to the predetermined Vpgm of a second set of WLGs. In some cases, when the PEC of the individual one of the memory components 112A to 112N transgresses the second threshold value, a second set of Vpgm adjustment values (e.g., a −2 adjustment value corresponding to −54 mV) can be applied to the predetermined Vpgm of the first set of WLGs and a first set of Vpgm adjustment values (e.g., −1 adjustment value corresponding to −27 mV) can be applied to the predetermined Vpgm of the second set of WLGs but not a third set of WLGs. In this way, using the table, the media operations manager 200 can dynamically control the write or program speed of different WLGs (e.g., by selectively adjusting the Vpgm of some of the WLGs) of an individual one of the memory components 112A to 112N on the basis of the PEC of that memory component and/or on the basis of the current temperature of the memory sub-system 110. This can thereby maintain the efficiency of operating the memory sub-system at an optimal level even when the EOL is being reached for certain memory components.

For example, FIGS. 4 and 5 are block diagrams of examples of tables used to selectively adjust the predetermined Vpgm of certain WL groups (WLGs), in accordance with some implementations of the present disclosure. Specifically, the table 400 of FIG. 4 can correspond to and be selected or accessed when the current temperature (when a request to program data is received) is above a threshold temperature value 410 (e.g., above 10 degrees Celsius). The table 400 includes a list of different WLGs including a first WLG 450 and a second WLG 460. Each WLG can include multiple WLs of the same quantity or different quantities. For each WLG, the table 400 can store a predetermined Vpgm 420 that indicates the default Vpgm to use to program data to the corresponding WLs in the WLG. For example, the first WLG 450 can be associated with a first predetermined Vpgm value 452 and the second WLG 460 can be associated with a second predetermined Vpgm value 462.

In some cases, the table 400 can store offset values 430 to apply to the predetermined Vpgm 420 of each WLG under different reliability conditions, such as for different PEC values. For example, a first set of offset values 432 can be applied to the predetermined Vpgm 420 to adjust (increase or reduce) the predetermined Vpgm 420 by a first specified amount when the PEC of the memory component associated with the WLG is below a first threshold value. A second set of offset values 434 can be applied to the predetermined Vpgm 420 to adjust (increase or reduce) the predetermined Vpgm 420 by a second specified amount when the PEC of the memory component associated with the WLG is above the first threshold value and below a second threshold value. A third set of offset values 436 can be applied to the predetermined Vpgm 420 to adjust (increase or reduce) the predetermined Vpgm 420 by a third specified amount when the PEC of the memory component associated with the WLG is above the second threshold value.

Specifically, the first WLG 450 can store a first value 454 for the first set of offset values 432 (e.g., 0). This indicates that when the PEC of the memory component to which data is to be written is below the first threshold value, the data is to be programmed to the WLs in the first WLG 450 using the first predetermined Vpgm value 452 of the first WLG 450. The first WLG 450 can store a second value 456 for the second set of offset values 434 (e.g., −1 digital to analog converter (DAC) value). This indicates that when the PEC of the memory component to which data is to be written is above the first threshold value but below the second threshold value, the data is to be programmed to the WLs in the first WLG 450 using the first predetermined Vpgm value 452 adjusted by the second value (e.g., −1*trim value of 27 mv), such as −27 mV. Similarly, the first WLG 450 can store a third value 458 for the third set of offset values 436 (e.g., −1 DAC value). This indicates that when the PEC of the memory component to which data is to be written is above the second threshold value, the data is to be programmed to the WLs in the first WLG 450 using the first predetermined Vpgm value 452 adjusted by the second value (e.g., −1*trim value of 27 mv), such as −27 mV.

In some examples, the table 400 for the second WLG 460 can store a first value 464 for the first set of offset values 432 (e.g., 0). This indicates that when the PEC of the memory component to which data is to be written is below the first threshold value, the data is to be programmed to the WLs in the second WLG 460 using the second predetermined Vpgm value 462. The second WLG 460 can store a second value 466 for the second set of offset values 434 (e.g., 0 DAC value). This indicates that when the PEC of the memory component to which data is to be written is above the first threshold value but below the second threshold value, the data is to be programmed to the WLs in the second WLG 460 using the second predetermined Vpgm value 462 without any adjustments. Similarly, the second WLG 460 can store a third value 468 for the third set of offset values 436 (e.g., 0 DAC value). This indicates that when the PEC of the memory component to which data is to be written is above the second threshold value, the data is to be programmed to the WLs in the second WLG 460 using the second predetermined Vpgm value 462 without any adjustments.

In some examples, the table 500 of FIG. 5 can correspond to and be selected or accessed when the current temperature (when a request to program data is received) is below the threshold temperature value 510 (e.g., below 10 degrees Celsius). The table 500 includes the same set of entries as the table 400 but can specify different offset values to apply to the predetermined Vpgm 420 for different WLGs. Specifically, whereas the table 400 included a first set of offsets or adjustment values 454, 456, and 458 for the first WLG 450, the same first WLG 450 in the table 500 can include a second set of offsets or adjustment values 454, 520, and 522. Namely, as shown in the table 500, the first WLG 450 can store the first value 454 for the first set of offset values 432 (e.g., 0). This indicates that when the PEC of the memory component to which data is to be written is below the first threshold value, the data is to be programmed to the WLs in the first WLG 450 using the predetermined Vpgm value 452 of the first WLG 450. The first WLG 450 can store a fourth value 520 for the second set of offset values 434 (e.g., −2 DAC value). This indicates that when the PEC of the memory component to which data is to be written is above the first threshold value but below the second threshold value, the data is to be programmed to the WLs in the first WLG 450 using the predetermined Vpgm value 452 adjusted by the second value (e.g., −2*trim value of 54 mv), such as −54 mV.

Namely, when the program temperature of the memory sub-system 110 is above the temperature threshold and when the PEC of the memory component is above the first threshold and less than the second threshold, the first WLG 450 is programmed using the second value 456 (e.g., −27 mV). However, when the program temperature of the memory sub-system 110 is below the temperature threshold and when the PEC of the memory component is above the first threshold and less than the second threshold, the first WLG 450 is programmed using the fourth value 520 (e.g., −54 mV). Similarly, the first WLG 450 can store a fifth value 522 for the third set of offset values 436 (e.g., −2 DAC value). This indicates that when the PEC of the memory component to which data is to be written is above the second threshold value, the data is to be programmed to the WLs in the first WLG 450 using the predetermined Vpgm value 452 adjusted by the second value (e.g., −2*trim value of 27 mv), such as −54 mV.

The table 500 also includes a WLG 530 for which, as shown in the table 400, under the condition that the temperature of the memory sub-system 110 is above the temperature threshold when the request to program is received, no adjustments were provided for the predetermined Vpgm 420 associated with the WLG 530. However, when the temperature of the memory sub-system 110 is below the temperature threshold when the request to program is received, the WLG 530, as shown in the table 500, is associated with adjustment values 534 and 536 to apply to the corresponding predetermined Vpgm 532 to program data.

Referring back to FIG. 2, the reliability measurement component 230 can be used to form different WLGs for the table 400 and/or the table 500. Namely, the reliability measurement component 230 can measure the RBER across all the WL of an individual memory component of the memory components 112A to 112N. The reliability measurement component 230 can then compare the RBER of an individual WL to the average RBER that was computed. The reliability measurement component 230 can determine that the RBER of the individual WL is below the average RBER by a first threshold amount. In response, the reliability measurement component 230 can generate a WLG that includes the WL for which the RBER is below the first threshold amount. The reliability measurement component 230 can store that WLG as one of the entries in the table 400 and/or table 500. The reliability measurement component 230 can identify other WLs that have similar RBER as the identified WL. The reliability measurement component 230 can add those other identified WLs to the same WLG. The reliability measurement component 230 can also determine that a second WL and/or a second set of WLs each include RBERs that are below the average RBER by a second threshold amount. The reliability measurement component 230 can then form another WLG that includes that second set of WLs and store that WLG in the table 400 and/or table 500. In some cases, the different WLGs are predetermined during manufacture of the memory sub-system 110.

In some examples, the reliability measurement component 230 can receive a request to program data to an individual memory component of the memory components 112A to 112N. In response, the reliability measurement component 230 can compute, access, or determine the current PEC value of the individual memory component. The reliability measurement component 230 can also measure a current temperature of the memory sub-system 110, such as by accessing a temperature sensor associated with the memory sub-system 110. The reliability measurement component 230 can retrieve the table 400 or the table 500 based on a comparison of the current temperature value of the memory sub-system 110 to a threshold temperature value.

The reliability measurement component 230 can then determine whether the current PEC value of the individual memory component is below the first threshold, above the first threshold but below a second threshold, or is above the second threshold. The reliability measurement component 230 can then select a set of adjustment values from the selected one of the tables 400 or 500 based on a comparison of the current PEC value to the PEC threshold values stored in the tables 400 and 500. The reliability measurement component 230 can adjust the Vpgm of the WLGs based on the adjustment values stored in the accessed one of the tables 400 and 500. The reliability measurement component 230 can provide the adjusted Vpgm values to the program voltage adjustment component 240 to program the data to the individual memory component according to the adjusted Vpgm values.

Figure 3:
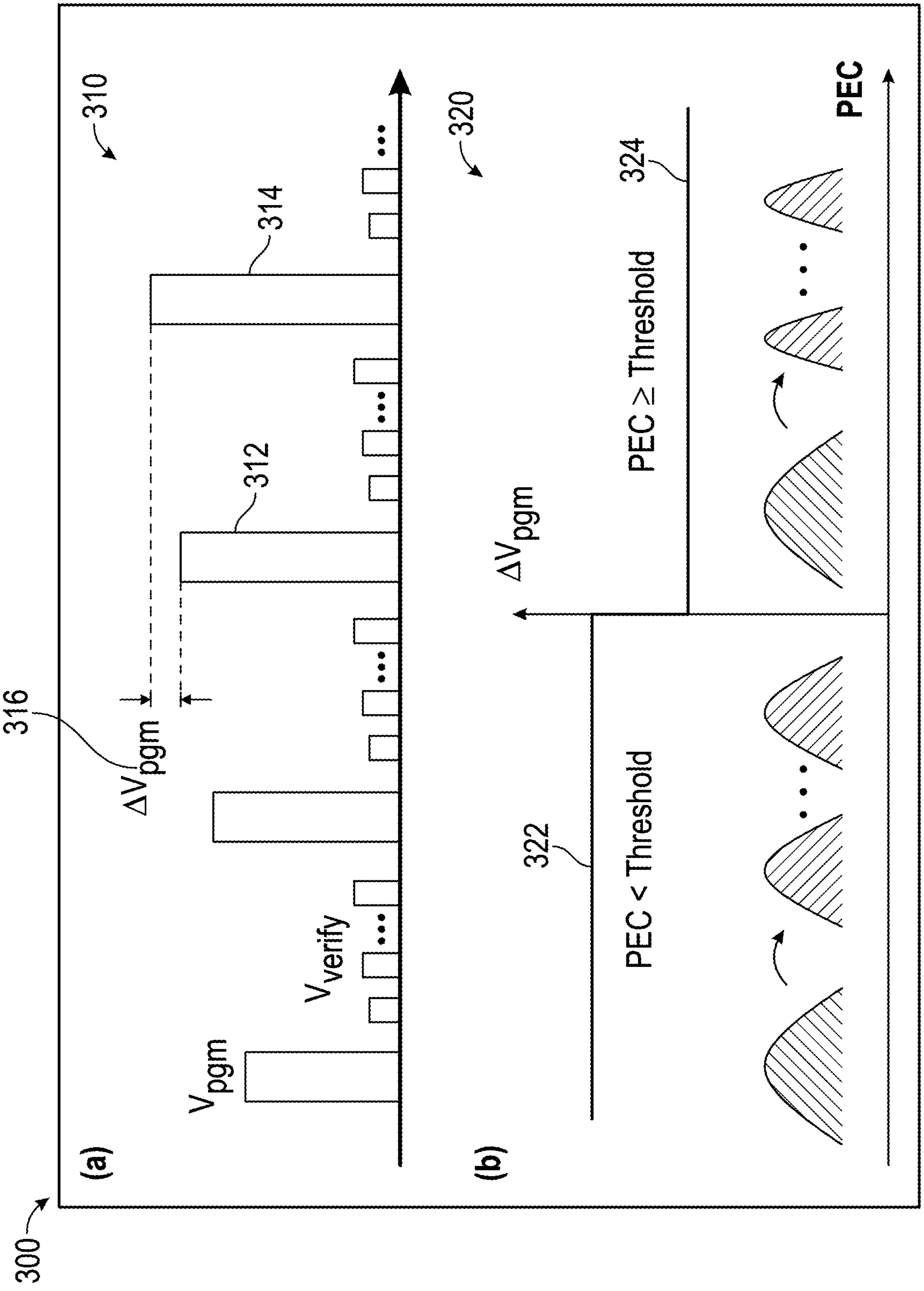
FIG. 3 is a block diagram of an example word line (WL) program voltage (Vpgm) adjustment for the memory sub-system, in accordance with some implementations of the present disclosure.

The program voltage adjustment component 240 can then program or store the data from the received request to the WLs of the individual memory component using different Vpgm values. For example, as shown in the diagram 300 of FIG. 3, for different WLs 310, different Vpgm values can be applied. For example, the program voltage adjustment component 240 can receive an adjustment 316 to a Vpgm 312 that is used to program data to an individual WL. The program voltage adjustment component 240 can then increase or decrease the Vpgm 312 based on the adjustment 316 to store data to the individual WL using an adjusted Vpgm value 314. In this way, the program voltage adjustment component 240 can store data to a first WL at the Vpgm 312 and can store data to a second WL at the adjusted Vpgm value 314.

As shown in the diagram 320, when the PEC 322 of the individual memory component is below a threshold, a first set of Vpgm adjustments are used to adjust Vpgm values of some of WLGs and not other WLGs. When the PEC 324 of the individual memory component is above the threshold, a second set of Vpgm adjustments are used to adjust Vpgm values of some of WLGs and not other WLGs, such as to decrease the Vpgm values used to program data in some WLs that may have a reliability value that is below a reliability threshold (e.g., having an RBER below a minimum RBER threshold value).

Figure 6:
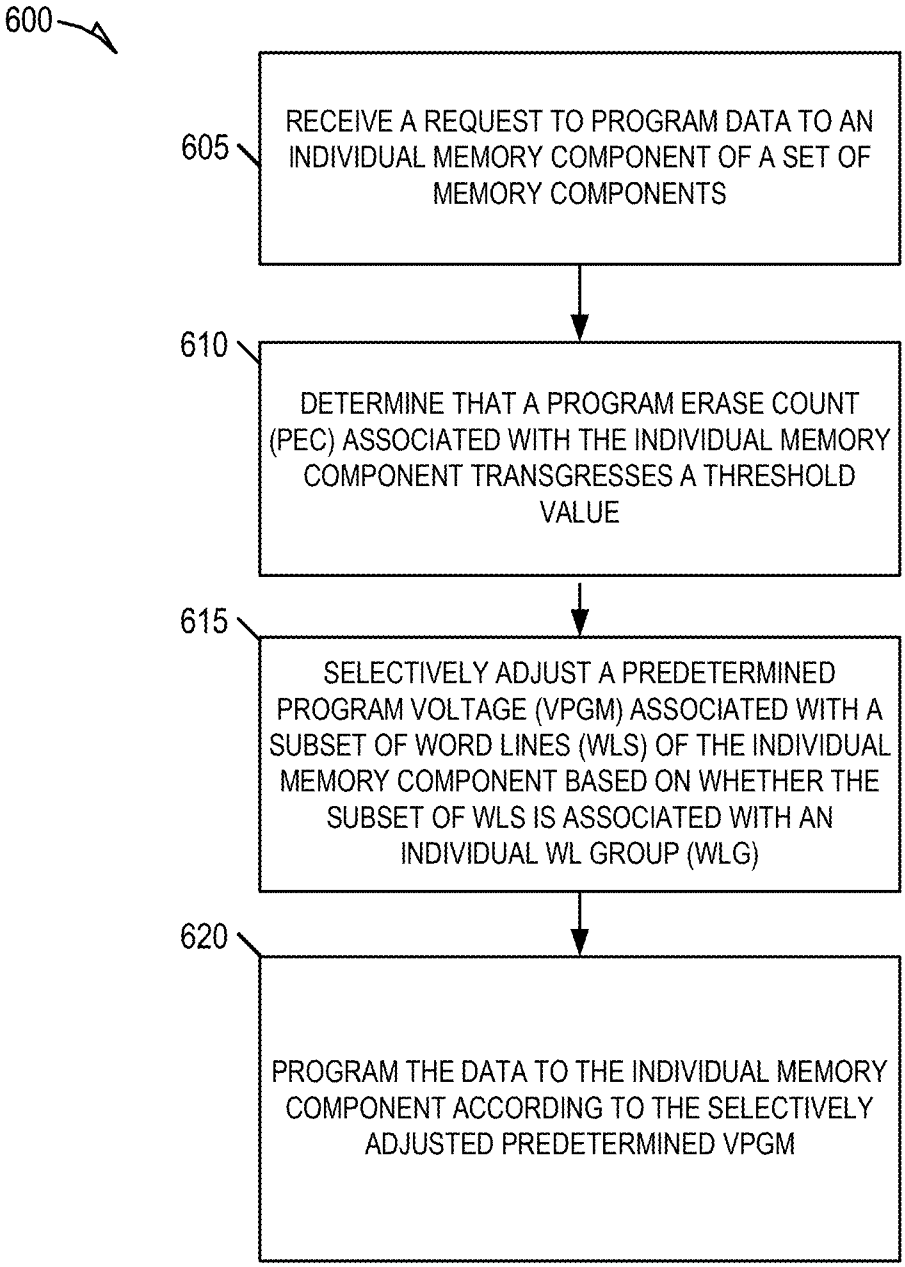
FIG. 6 is a flow diagram of an example method to selectively adjust the predetermined Vpgm of certain WLGs, in accordance with some implementations of the present disclosure.

FIG. 6 is a flow diagram of an example method 600 to selectively adjust the predetermined Vpgm of certain WLGs, in accordance with some implementations of the present disclosure. The method 600 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method 600 is performed by the media operations manager 122 of FIG. 1. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to FIG. 6, the method (or process) 600 begins at operation 605, with a media operations manager 122 of a memory sub-system (e.g., memory sub-system 110) receiving a request to program data to an individual memory component of a set of memory components. Then, at operation 610, the media operations manager 122 of the memory sub-system determines that a program erase count (PEC) associated with the individual memory component transgresses a threshold value. Thereafter, at operation 615, the media operations manager 122, in response to determining that the PEC associated with the individual memory component transgresses the threshold value, selectively adjusts a predetermined Vpgm associated with a subset of WLs of the individual memory component based on whether the subset of WLs is associated with an individual WLG. Then, at operation 620, the media operations manager 122 programs the data to the individual memory component according to the selectively adjusted predetermined Vpgm.

In view of the disclosure above, various examples are set forth below. It should be noted that one or more features of an example, taken in isolation or combination, should be considered within the disclosure of this application.

Example 1: A system comprising: a set of memory components of a memory sub-system; and at least one processing device operatively coupled to the set of memory components, the at least one processing device being configured to perform operations comprising: receiving a request to program data to an individual memory component of the set of memory components; determining that a program erase count (PEC) associated with the individual memory component transgresses a threshold value; in response to determining that the PEC associated with the individual memory component transgresses the threshold value, selectively adjusting a program voltage (Vpgm) associated with a subset of word lines (WLs) of the individual memory component based on whether the subset of WLs is associated with an individual WL group (WLG); and programming the data to the individual memory component according to the selectively adjusted Vpgm.

Example 2. The system of Example 1, wherein the memory sub-system comprises a three-dimensional (3D) NAND memory.

Example 3. The system of any one of Examples 1-2, the operations comprising: determining that a first set of WLs of the individual memory component is associated with a first WLG; determining that a second set of WLs of the individual memory component is associated with a second WLG; adjusting the Vpgm associated with the first set of WLs in response to determining that the first set of WLs are associated with the first WLG; and programming data to the individual memory component using the adjusted Vpgm for the first set of WLs and using the Vpgm for the second set of WLs.

Example 4. The system of Example 3, wherein the first WLG comprises a first plurality of WLs having a first reliability value that falls below a reliability threshold, and wherein the second WLG comprises a second plurality of WLs having a second reliability value that exceeds the reliability threshold.

Example 5. The system of Example 4, wherein the first and second reliability values comprise respective read bit error rates (RBERs), and wherein the reliability threshold comprises a minimum RBER.

Example 6. The system of any one of Examples 1-5, the operations comprising: accessing configuration data comprising a table that associates different WLGs with respective Vpgm adjustments based on PEC values.

Example 7. The system of Example 6, wherein the table comprises: a first WLG associated with a first Vpgm; a first PEC threshold associated with a first adjustment to the first Vpgm; and a second PEC threshold associated with a second adjustment to the first Vpgm.

Example 8. The system of Example 7, wherein the table further comprises: a second WLG associated with a second Vpgm; the first PEC threshold associated with a third adjustment to the second Vpgm; and the second PEC threshold associated with a fourth adjustment to the second Vpgm.

Example 9. The system of any one of Examples 1-8, wherein adjusting the Vpgm comprises applying a step static threshold voltage to the Vpgm.

Example 10. The system of any one of Examples 1-9, the operations comprising: determining a current temperature associated with the memory sub-system; and selecting an adjustment value to apply to the Vpgm based on the current temperature.

Example 11. The system of Example 10, the operations comprising: determining that the current temperature is below a threshold temperature value; and in response to determining that the current temperature is below the threshold temperature value, applying a first adjustment to the Vpgm associated with the subset of WLs.

Example 12. The system of Example 11, the operations comprising: determining that the current temperature is above the threshold temperature value; and in response to determining that the current temperature is above the threshold temperature value, applying a second adjustment to the Vpgm associated with the subset of WLs.

Example 13. The system of Example 12, wherein the second adjustment is lower than the first adjustment.

Example 14. The system of any one of Examples 12-13, the operations comprising: identifying a second subset of WLs associated with a second WLG having a Vpgm that is associated with an adjustment to a corresponding Vpgm when the current temperature is below the threshold temperature value and for which the corresponding Vpgm remains unchanged when the current temperature is above the threshold temperature value.

Example 15. The system of any one of Examples 10-14, the operations comprising: storing first and second tables, the first table comprising a first set of adjustments to apply to Vpgms of WLGs when the current temperature is below a threshold temperature value, the second table comprising a second set of adjustments to apply to Vpgms of WLGs when the current temperature is above the threshold temperature value.

Example 16. The system of Example 15, the operations comprising: selectively accessing one of the first and second tables based on the current temperature of the memory sub-system.

Example 17. The system of any one of Examples 1-16, wherein the threshold value comprises at least 3000 PEC.

Example 18. The system of any one of Examples 1-17, wherein the threshold value comprises a first threshold value, the operations comprising: adjusting the Vpgm associated with the subset of WLs by a second amount in response to determining that the PEC associated with the individual memory component transgresses a second threshold value that is greater than the first threshold value.

Methods and Computer-Readable Storage Medium with Instructions for Performing any One of the Above Examples.

Figure 7:
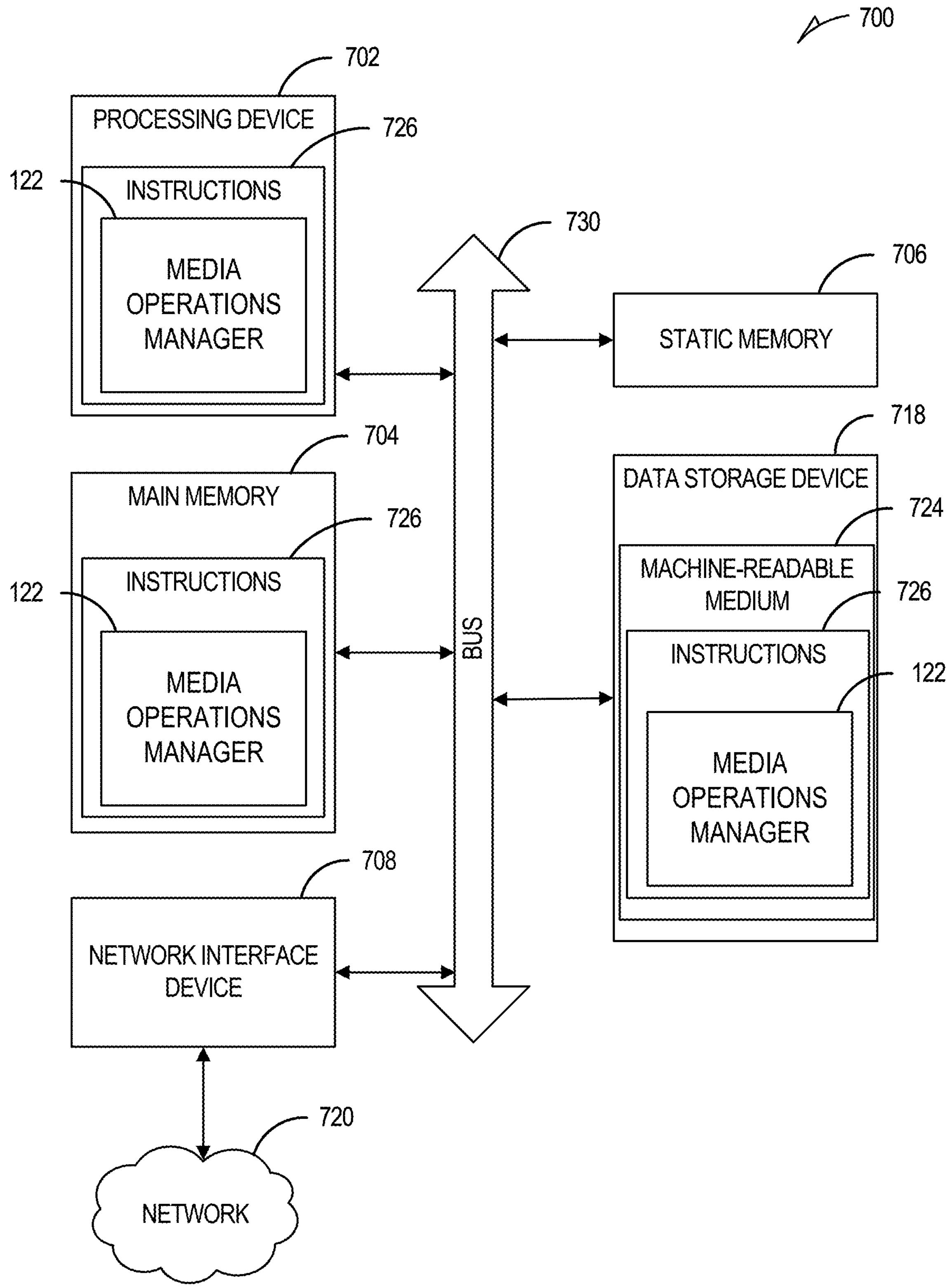
FIG. 7 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media operations manager 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730.

The processing device 702 represents one or more general-purpose processing devices such as a microprocessor, a central processing unit, or the like. More particularly, the processing device 702 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), a network processor, or the like. The processing device 702 is configured to execute instructions 726 for performing the operations and steps discussed herein. The computer system 700 can further include a network interface device 708 to communicate over a network 720.

The data storage device 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage device 718, and/or main memory 704 can correspond to the memory sub-system 110 of FIG. 1.

In one embodiment, the instructions 726 implement functionality corresponding to the media operations manager 122 of FIG. 1. While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from the broader scope of the disclosure as set forth in the following claims. The specification and drawings are, accordingly, to be regarded in an illustrative sense rather than a restrictive sense.

What is claimed is:

1. A system comprising:

a set of memory components of a memory sub-system; and at least one processing device operatively coupled to the set of memory components, the at least one processing device being configured to perform operations comprising:

receiving a request to program data to an individual memory component of the set of memory components;

determining that a program erase count (PEC) associated with the individual memory component transgresses a threshold value;

in response to determining that the PEC associated with the individual memory component transgresses the threshold value, selectively adjusting a program voltage (Vpgm) associated with a subset of word lines (WLs) of the individual memory component based on whether the subset of WLs is associated with an individual WL group (WLG), a first set of WLs being associated with a first WLG and a second set of WLs being associated with a second WLG, the first WLG comprising WLs having a first reliability value that falls below a reliability threshold, and the second WLG comprising WLs having a second reliability value that exceeds the reliability threshold; and programming the data to the individual memory component according to the selectively adjusted Vpgm.

2. The system of claim 1, wherein the memory sub-system comprises a three-dimensional (3D) NAND memory.

3. The system of claim 1, the operations comprising:

adjusting the Vpgm associated with the first set of WLs in response to determining that the first set of WLs are associated with the first WLG; and programming data to the individual memory component using the adjusted Vpgm for the first set of WLs and using the Vpgm for the second set of WLs.

4. The system of claim 1, wherein the first and second reliability values comprise respective read bit error rates (RBERs), and wherein the reliability threshold comprises a minimum RBER.

5. The system of claim 1, the operations comprising:

accessing configuration data comprising a table that associates different WLGs with respective Vpgm adjustments based on PEC values.

6. The system of claim 5, wherein the table comprises:

the first WLG associated with:

a first Vpgm;

a first PEC threshold associated with a first adjustment to the first Vpgm; and a second PEC threshold associated with a second adjustment to the first Vpgm.

7. The system of claim 6, wherein the table further comprises:

the second WLG associated with:

a second Vpgm;

the first PEC threshold associated with a third adjustment to the second Vpgm; and the second PEC threshold associated with a fourth adjustment to the second Vpgm.

8. The system of claim 1, wherein adjusting the Vpgm comprises applying a step static threshold voltage to the Vpgm.

9. The system of claim 1, the operations comprising:

determining a current temperature associated with the memory sub-system; and selecting an adjustment value to apply to the Vpgm based on the current temperature.

10. The system of claim 9, the operations comprising:

determining that the current temperature is below a threshold temperature value; and in response to determining that the current temperature is below the threshold temperature value, applying a first adjustment to the Vpgm associated with the subset of WLs.

11. The system of claim 10, the operations comprising:

determining that the current temperature is above the threshold temperature value; and in response to determining that the current temperature is above the threshold temperature value, applying a second adjustment to the Vpgm associated with the subset of WLs.

12. The system of claim 11, wherein the second adjustment is lower than the first adjustment.

13. The system of claim 11, the operations comprising:

identifying a second subset of WLs associated with a second WLG having a Vpgm that is associated with an adjustment to a corresponding Vpgm when the current temperature is below the threshold temperature value and for which the corresponding Vpgm remains unchanged when the current temperature is above the threshold temperature value.

14. The system of claim 9, the operations comprising:

storing first and second tables, the first table comprising a first set of adjustments to apply to Vpgms of WLGs when the current temperature is below a threshold temperature value, the second table comprising a second set of adjustments to apply to Vpgms of WLGs when the current temperature is above the threshold temperature value.

15. The system of claim 14, the operations comprising:

selectively accessing one of the first and second tables based on the current temperature of the memory sub-system.

16. The system of claim 1, wherein the threshold value comprises at least 3000 PEC.

17. The system of claim 1, wherein the threshold value comprises a first threshold value, the operations comprising:

adjusting the Vpgm associated with the subset of WLs by a second amount in response to determining that the PEC associated with the individual memory component transgresses a second threshold value that is greater than the first threshold value.

18. A method comprising:

receiving a request to program data to an individual memory component of a set of memory components;

determining that a program erase count (PEC) associated with the individual memory component transgresses a threshold value;

in response to determining that the PEC associated with the individual memory component transgresses the threshold value, selectively adjusting a program voltage (Vpgm) associated with a subset of word lines (WLs) of the individual memory component based on whether the subset of WLs is associated with an individual WL group (WLG), a first set of WLs being associated with a first WLG and a second set of WLs being associated with a second WLG, the first WLG comprising WLs having a first reliability value that falls below a reliability threshold, and the second WLG comprising WLs having a second reliability value that exceeds the reliability threshold; and programming the data to the individual memory component according to the selectively adjusted Vpgm.

19. A non-transitory computer-readable storage medium comprising instructions that, when executed by at least one processing device, cause the at least one processing device to perform operations comprising:

receiving a request to program data to an individual memory component of a set of memory components;

determining that a program erase count (PEC) associated with the individual memory component transgresses a threshold value;

in response to determining that the PEC associated with the individual memory component transgresses the threshold value, selectively adjusting a program voltage (Vpgm) associated with a subset of word lines (WLs) of the individual memory component based on whether the subset of WLs is associated with an individual WL group (WLG), a first set of WLs being associated with a first WLG and a second set of WLs being associated with a second WLG, the first WLG comprising WLs having a first reliability value that falls below a reliability threshold, and the second WLG comprising WLs having a second reliability value that exceeds the reliability threshold; and programming the data to the individual memory component according to the selectively adjusted Vpgm.

20. The method of claim 18, comprising:

identifying a second subset of WLs associated with a second WLG having a Vpgm that is associated with an adjustment to a corresponding Vpgm when a current temperature is below a threshold temperature value and for which the corresponding Vpgm remains unchanged when the current temperature is above the threshold temperature value.

* * * * *